US006845013B2

(12) United States Patent
Hartke et al.

(10) Patent No.: US 6,845,013 B2
(45) Date of Patent: Jan. 18, 2005

(54) RIGHT-ANGLE POWER INTERCONNECT ELECTRONIC PACKAGING ASSEMBLY

(75) Inventors: David H. Hartke, Durango, AZ (US); J. Ted DiBene, II, Oceanside, CA (US)

(73) Assignee: Incep Technologies, Inc., San Diego, CA (US)

( * ) Notice: Subject to any disclaimer, the term of this patent is extended or adjusted under 35 U.S.C. 154(b) by 113 days.

(21) Appl. No.: 10/384,057

(22) Filed: Mar. 4, 2003

(65) Prior Publication Data

US 2003/0181075 A1 Sep. 25, 2003

Related U.S. Application Data (60) Provisional application No. 60/361,554, filed on Mar. 4, 2002, and provisional application No. 60/377,557, filed on May 3, 2002.

(51) Int. Cl.$^7$ ................................................. H05K 7/20
(52) U.S. Cl. ....................... 361/704; 361/707; 361/719; 361/749; 361/785; 257/722; 174/16.3; 165/80.3; 165/185
(58) Field of Search ................................ 361/704, 707, 361/709, 718–721, 785, 786, 784, 776, 788; 257/906; 174/16.1, 16.3, 260, 262, 252; 439/67, 77, 485, 487, 501, 502

(56) References Cited

U.S. PATENT DOCUMENTS

| | | | |
|---|---|---|---|
| 3,596,138 A | 7/1971 | Lehrfeld | |
| 3,854,374 A | 12/1974 | Boyle et al. | |
| 4,358,503 A | 11/1982 | Homeyer | |
| 4,446,173 A | 5/1984 | Barrell et al. | |
| 4,498,530 A | 2/1985 | Lipshutz | |
| 4,502,193 A | 3/1985 | Harmon et al. | |
| 4,521,829 A | 6/1985 | Wessely | |
| 4,589,057 A | 5/1986 | Short | |
| 4,724,901 A | 2/1988 | Munekawa | |
| 4,742,385 A | 5/1988 | Kohmoto | |
| 4,760,495 A | 7/1988 | Till | |
| 4,771,365 A | 9/1988 | Cichocki et al. | |
| 4,875,140 A | 10/1989 | Delpech et al. | |
| 4,942,497 A | 7/1990 | Mine et al. | |
| 4,974,119 A | 11/1990 | Martin | |
| 4,982,311 A | 1/1991 | Dehaine et al. | |
| 5,052,481 A | 10/1991 | Horvath et al. | |
| 5,065,280 A | 11/1991 | Karnezos et al. | |
| 5,092,783 A | 3/1992 | Suarez et al. | |
| 5,161,089 A | 11/1992 | Chu et al. | |
| 5,194,480 A | 3/1993 | Block et al. | |
| 5,195,020 A | 3/1993 | Suzuki et al. | |
| 5,198,889 A | 3/1993 | Hisano et al. | |
| 5,216,580 A | 6/1993 | Davidson et al. | |
| 5,258,887 A | 11/1993 | Fortune | |
| 5,272,599 A | 12/1993 | Koenen | |
| 5,312,508 A | 5/1994 | Chisolm | |
| 5,315,069 A | 5/1994 | Gebara | |
| 5,331,510 A | 7/1994 | Ouchi et al. | |
| 5,343,358 A | 8/1994 | Hilbrink | |
| 5,345,366 A | 9/1994 | Cheng et al. | |
| 5,355,282 A | 10/1994 | Yokemura et al. | |
| 5,359,493 A | * 10/1994 | Chiu | ........................ 361/719 |
| 5,365,402 A | 11/1994 | Hatada et al. | |
| 5,380,211 A | 1/1995 | Kawaguchi et al. | |
| 5,386,143 A | 1/1995 | Fitch | |
| 5,390,078 A | 2/1995 | Taylor | |
| 5,396,403 A | 3/1995 | Patel | |
| 5,409,055 A | 4/1995 | Tanaka et al. | |

(List continued on next page.)

Primary Examiner—Boris Chervinsky
(74) Attorney, Agent, or Firm—Knobbe Martens Olson & Bear LLP (57) ABSTRACT

The assembly includes a mother board having a processor carrier having a processor attached thereto. A heat sink is thermally coupled to the processor carrier and is located on top of the carrier. A voltage regulating module board is electrically coupled to the processor carrier and is configured to be positioned adjacent to the heat sink and at substantially a right angle to the mother board.

13 Claims, 12 Drawing Sheets

U.S. PATENT DOCUMENTS

| | | |
|---|---|---|
| 5,460,543 A | 10/1995 | Kosmala |
| 5,467,251 A | 11/1995 | Katchmar |
| 5,473,510 A | 12/1995 | Dozier, II |
| 5,504,924 A | 4/1996 | Ohashi et al. |
| 5,510,958 A | 4/1996 | Shimabara et al. |
| 5,515,241 A | 5/1996 | Werther |
| 5,515,912 A | 5/1996 | Daikoku et al. |
| 5,520,976 A | 5/1996 | Giannetti et al. |
| 5,544,017 A | 8/1996 | Beilin et al. |
| 5,545,473 A | 8/1996 | Ameen et al. |
| 5,586,011 A | 12/1996 | Alexander |
| 5,591,034 A | 1/1997 | Ameen et al. |
| 5,608,610 A | 3/1997 | Brzezinski |
| 5,617,300 A | 4/1997 | Anzawa et al. |
| 5,619,399 A | 4/1997 | Mok |
| 5,621,615 A | 4/1997 | Dawson et al. |
| 5,632,158 A | 5/1997 | Tajima |
| 5,646,826 A | 7/1997 | Katchmar |
| 5,647,430 A | 7/1997 | Tajima |
| 5,661,902 A | 9/1997 | Katchmar |
| 5,694,297 A | 12/1997 | Smith et al. |
| 5,704,416 A | 1/1998 | Larson et al. |
| 5,708,566 A | 1/1998 | Hunninghaus et al. |
| 5,721,454 A | 2/1998 | Palmer |
| 5,729,433 A | 3/1998 | Mok |
| 5,734,555 A | 3/1998 | McMahon |
| 5,738,936 A | 4/1998 | Hanrahan |
| 5,754,412 A | 5/1998 | Clavin |
| 5,761,043 A | 6/1998 | Salmonson |
| 5,783,316 A | 7/1998 | Colella et al. |
| 5,786,075 A | 7/1998 | Mishuku et al. |
| 5,794,454 A | 8/1998 | Harris et al. |
| 5,796,582 A | 8/1998 | Katchmar |
| 5,800,905 A | 9/1998 | Sheridan et al. |
| 5,801,924 A | 9/1998 | Salmonson |
| 5,815,921 A | 10/1998 | Burward-Hoy |
| 5,825,630 A | 10/1998 | Taylor et al. |
| 5,825,633 A | 10/1998 | Bujalski et al. |
| 5,842,514 A | 12/1998 | Zapach et al. |
| 5,856,911 A | 1/1999 | Riley |
| 5,864,466 A | 1/1999 | Remsberg |
| 5,864,478 A | 1/1999 | McCutchan et al. |
| 5,898,573 A | 4/1999 | Fugaro |
| 5,904,796 A | 5/1999 | Freuler et al. |
| 5,905,638 A | 5/1999 | MacDonald, Jr. et al. |
| 5,920,458 A | 7/1999 | Azar |
| 5,930,115 A | 7/1999 | Tracy et al. |
| 5,945,217 A | 8/1999 | Hanrahan |
| 5,956,835 A | 9/1999 | Aksu |
| 5,966,294 A | 10/1999 | Harada et al. |
| 5,974,662 A | 11/1999 | Eldridge et al. |
| 5,980,267 A | 11/1999 | Ayers et al. |
| 5,981,869 A | 11/1999 | Kroger |
| 5,982,635 A | 11/1999 | Menzies et al. |
| 5,986,887 A | 11/1999 | Smith et al. |
| 5,995,370 A | 11/1999 | Nakamori |
| 6,014,313 A | 1/2000 | Hesselbom |
| 6,018,465 A | 1/2000 | Borkar et al. |
| 6,031,727 A | 2/2000 | Duesman et al. |
| 6,037,659 A | 3/2000 | Weixel |
| 6,062,302 A | 5/2000 | Davis et al. |
| 6,092,281 A | 7/2000 | Glenn |
| 6,096,414 A | 8/2000 | Young |
| 6,101,094 A * | 8/2000 | Kermaani et al. .......... 361/720 |
| 6,131,646 A | 10/2000 | Kelley |
| 6,137,693 A | 10/2000 | Schwiebert et al. |
| 6,157,544 A | 12/2000 | Ferling et al. |
| 6,191,475 B1 | 2/2001 | Skinner et al. |
| 6,191,945 B1 | 2/2001 | Belady et al. |
| 6,222,265 B1 | 4/2001 | Akram et al. |
| 6,225,566 B1 | 5/2001 | Dienst |
| 6,231,352 B1 | 5/2001 | Gonzales |
| 6,237,223 B1 | 5/2001 | McCullough |
| 6,262,887 B1 | 7/2001 | Lee |
| 6,265,672 B1 | 7/2001 | Eum et al. |
| 6,285,550 B1 | 9/2001 | Belady |
| 6,297,551 B1 | 10/2001 | Dudderar et al. |
| 6,303,989 B1 * | 10/2001 | Yasuho et al. ............. 257/706 |
| 6,304,450 B1 | 10/2001 | DiBene, II et al. |
| 6,338,634 B1 | 1/2002 | Yu |
| 6,341,066 B1 * | 1/2002 | Murowaki et al. .......... 361/707 |
| 6,347,042 B1 | 2/2002 | White |
| 6,347,044 B1 | 2/2002 | Won et al. |
| 6,351,392 B1 | 2/2002 | Palaniappa |
| 6,352,203 B1 * | 3/2002 | Brainard et al. ............ 235/451 |
| 6,354,844 B1 * | 3/2002 | Coico et al. .................. 439/66 |
| 6,356,448 B1 | 3/2002 | DiBene, II et al. |
| 6,359,783 B1 | 3/2002 | Noble |
| 6,360,431 B1 | 3/2002 | Harrison et al. |
| 6,390,829 B1 | 5/2002 | Rademacher |
| 6,392,899 B1 | 5/2002 | Harrison et al. |
| 6,399,887 B1 | 6/2002 | Lin |
| 6,493,233 B1 | 12/2002 | De Lorenzo et al. |
| 6,523,253 B1 | 2/2003 | Harrison et al. |
| 6,532,157 B1 * | 3/2003 | Glenn et al. ................ 361/767 |
| 2002/0040811 A1 | 4/2002 | Harrison et al. |
| 2002/0042214 A1 | 4/2002 | Harrison et al. |
| 2002/0105791 A1 | 8/2002 | Harrison et al. |

* cited by examiner

RIGHT-ANGLE POWER INTERCONNECT ELECTRONIC PACKAGING ASSEMBLY

CROSS-REFERENCE TO RELATED APPLICATIONS

This application claims priority to U.S. Provisional Patent Application No. 60/361,554, filed Mar. 4, 2002, by David H. Hartke and entitled "RIGHT ANGLE POWER CONNECTOR ARCHITECTURE" and U.S. Provisional Patent Applications No. 60/377,557, filed May 3, 2002, by DiBene, et. al. and entitled "EVRM STACK-UP, POWER DELIVERY SOLUTION", the disclosures of which are incorporated herein by reference in their entirety.

CROSS-REFERENCE TO RELATED PATENTS

The following patents are incorporated by reference herein as related art U.S. Pat. No. 6,452,113, issued Sep. 17, 2002, by DiBene II, et al. and entitled "APPARATUS FOR PROVIDING POWER TO A MICROPROCESSOR WITH INTEGRATED THERMAL AND EMI MANAGEMENT", U.S. Pat. No. 6,392,899, issued May 21, 2002, by Harrison, et al. and entitled "PROCESSOR POWER DELIVERY SYSTEM", and U.S. Pat. No. 5,980,267, issued Nov. 9, 1999 by Ayers, et al. and entitled "CONNECTOR SCHEME FOR A POWER POD DELIVERY SYSTEM".

BACKGROUND OF THE INVENTION

1. Field of the Invention

This invention relates to a power distribution architecture and to such architecture where the power converter, or voltage regulation module (VRM), is mounted adjacent to a heatsink which cools an electronic device (such as a microprocessor) and where the VRM is interconnected electrically to the device package itself either directly or indirectly.

2. Description of the Related Art

High performance electronics today are demanding higher performance and lower cost power delivery than in previous years. As an example, high performance microprocessors are forcing power converters to supply voltages at 1V and below and deliver power over 100W. This translates to delivered currents in excess of 100 amps. Moreover, the small space allocated on mother boards and other printed circuit boards, along with the thermal considerations at the system level, require the voltage regulators to be highly efficient, have low noise, have low interconnect paths, and maintain very small form factors. This trend is creating new problems and challenges in power conversion technology and in packaging architectures for the VRM and microprocessors.

Today, there are numerous methods by which power is delivered to a high performance electronic device, such as a microprocessor. Typically, the power has been brought through the main board or mother board of the system, through the device socket and then into the microprocessor itself. Though this has been effective for many generations of microprocessors and high performance electronic devices it has its drawbacks. The voltage regulator components typically take up much real-estate on the mother board. Due to routing constraints the power is typically bused through only one side of the device and through a limited number of power/ground plane pairs. This results in not only a high DC resistance path but also a relatively high inductive path which increases AC and DC losses and can disrupt power delivery to the device itself.

Other approaches have removed this burden of busing power through the mother board by bringing power to one side of the substrate through an edge-card type connection or powerpod interconnect. This architecture bypasses the mother board and supplies power directly into the side of the substrate or interposer of the device. However, this approach is relatively expensive due to the complexity of the substrate design and the power module mechanical construction.

Another approach has been to bring power directly to the surface of the microprocessor through a z-axis power delivery approach. In this architecture, power is integrated with the thermal solution and is directly attached to the device package through a disconnectable interconnect. However, the VRM is oriented horizontal and is located above and over the device package. The power interconnection is made to the device package substrate surface on one or more sides. Thus, this architecture is somewhat integrated with the thermal solution of the device package. Though this may be desirable in many cases, in some designs where one wishes to disconnect the VRM without disrupting the thermal solution to the device package, an alternative approach is needed.

SUMMARY OF THE INVENTION

To address the requirements described above, and other needs, the present invention relates to a methods and an assemblies which provide a VRM board for a processor carrier.

In one aspect of the invention a VRM board is mounted at substantially a right angle to a processor carrier.

One aspect of the invention relates to an assembly including a mother board. A processor carrier is mounted to the mother board and a processor is mounted on the processor carrier. A heat sink is thermally coupled to the processor and is located adjacent to the top surface of the processor. A circuit board with a power conditioning circuit is mounted at substantially a right angle to the mother board and adjacent to the heat sink. An interconnect assembly provides an electrical path between electrical contacts of the processor carrier and the circuit board.

In one aspect of the invention an interconnect assembly provides a releasable connection for the processor carrier and/or the VRM board.

In another aspect of the invention a method includes mounting a processor carrier having a processor on a mother board. A heat sink is thermally coupled to the processor and is located over the processor. A VRM board is electrically coupled to the processor carrier and mounted so that the plane of VRM board is substantially orthogonal to the plane of the mother board.

The foregoing and aspects and other advantages of the invention will be apparent to those who are skilled in the art upon reviewing the detailed description in conjunction with the included drawings.

BRIEF DESCRIPTION OF THE DRAWINGS

Referring now to the drawings in which like reference numbers represent corresponding parts throughout.

DETAILED DESCRIPTION

In the following description, reference is made to the accompanying drawings which form a part hereof, and which is shown, by way of illustration, several embodiments of the present invention. It is understood that other embodiments may be utilized and changes may be made without departing from the scope of the present invention.

Figure 1A:
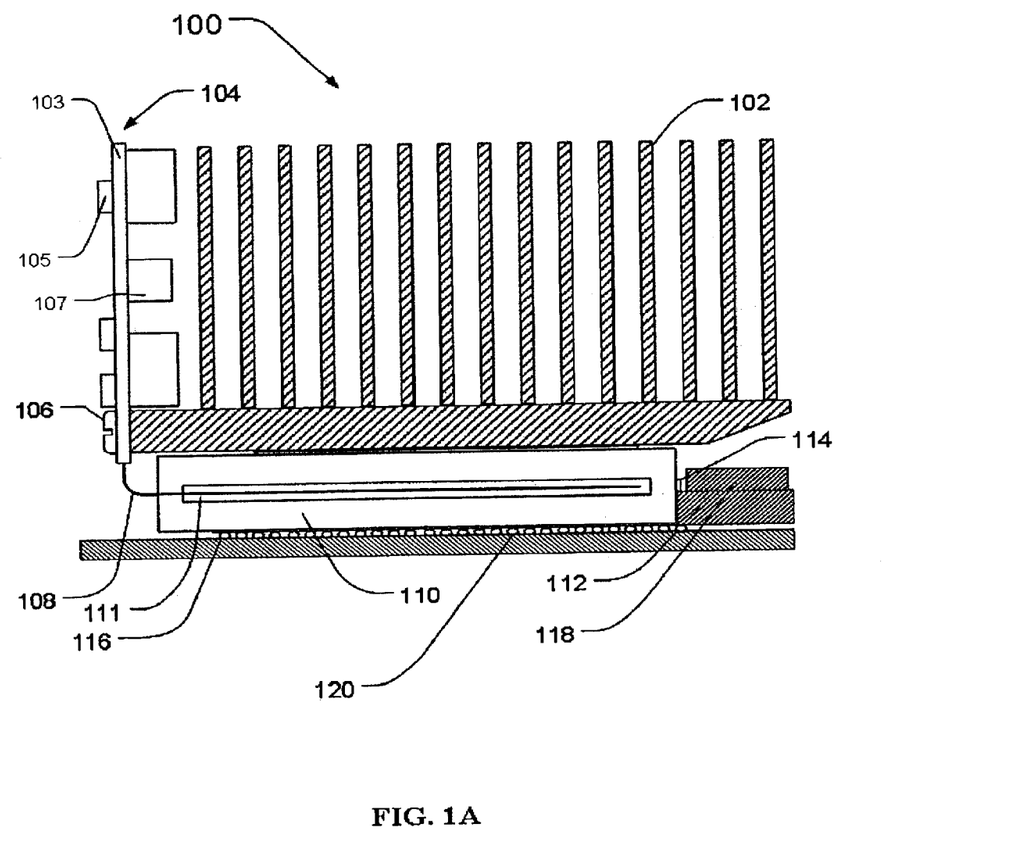
FIG. 1A is a side view of the right-angle VRM architecture for an unmodified interposer where an edge connector is connected to the end of the package on one side.

Referring to FIG. 1A, an assembly 100 is shown in a side 'end' view—that is, shown from the perspective of one end of the assembly. Assembly 100 comprises a heat dissipating device 102, such as a heat sink, and a VRM subassembly 104. VRM subassembly 104 can include one or more power components on either or both sides of the VRM board 103, such as component 105 shown on the front side of the VRM board or PCB 103 and component 107 shown on the back side of the VRM board 103. Such components are used as part of a power conditioning circuit, such as a DC-to-DC converter, located on the VRM board 103. The VRM assembly 104 is shown mounted to heatsink 102 via a fastening mechanism such as fastener 106. The VRM assembly can be mounted to the heat dissipating device 102 using a removable fastener 106 or it can be permanently attached such as by soldering or gluing. Assembly 100 further includes an interconnect assembly including a flex circuit 108 which connects to an edge card connector 110. The edge connector connects to an edge of the interposer board 114. The flex circuit 108 connects to the edge connector 110 at a connection 111. Interposer board 114 connects to a socket 112 with a socket actuation section 118. The socket 112 connects to a main board 116 (which may be a mother board or other printed circuit board with electronic components) through interconnect 120 which is typically a ball grid array or maybe another interconnection methodology, such as a pin grid array or LAN grid array (LGA). Additionally, socket 112 may also be an LGA or some other socket type in which case actuation section 118 may or may not be required.

Figure 1B:
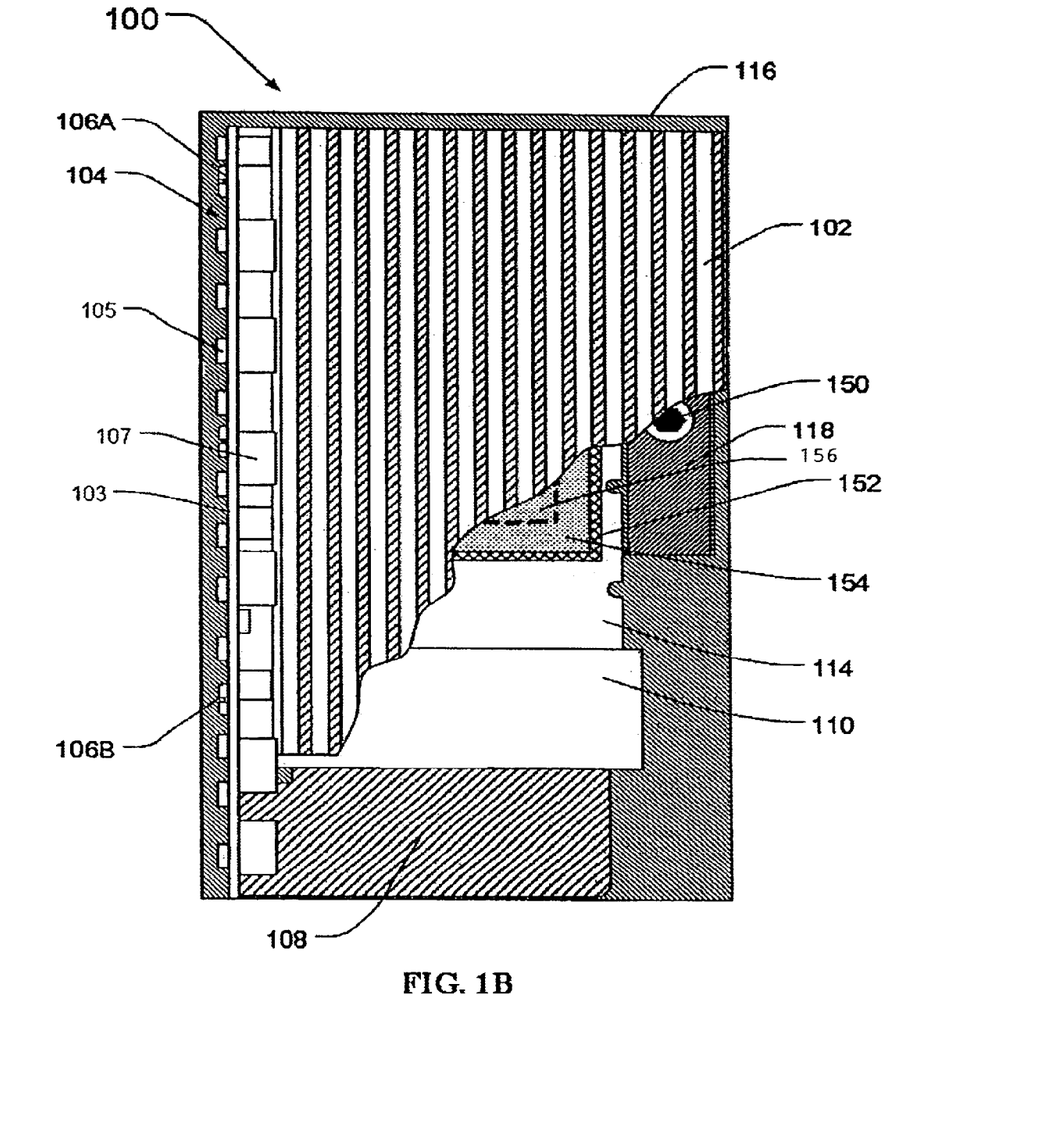
FIG. 1B is a top view of the embodiment shown in FIG. 1A with a section taken out to show the connection methods.

FIG. 1B shows a partial cut-away top view of the assembly shown in FIG. 1A. Note that fasteners 106A and 106B are shown on each end of the VRM subassembly 104 to ensure adequate attachment to heatsink 102. Additionally, as can be seen in this view, flex circuit 108 egresses to the right side of VRM PCB 103 and connects to edge-card connector 110 which in turn connects to interposer 114. This orientation is conductive to design where it is easier to connect the interposer on the end of the substrate and require less modification to the imposer. Typically, another substrate such as substrate 152 connects to interposer 114. An electronic device, such as a microprocessor, 156, is typically mounted to substrate 152 with lid 154 which protects the device from damage and helps in spreading heat for thermal management. Socket 112 typically has an actuation mechanism 118 with a feature such as a locking mechanism 150 for locking down the interposer to the socket and securing the electrical connections to the main board 116.

The interposer 114, and substrate 152 can collectively be referred to as a processor carrier. The term processor carrier also encompasses other arrangements used to couple a processor to a main board or mother board. For example, processor carriers include an organic land grid array (OLGA) with an interposer. Additionally, multiple processors and other devices can be packaged on the same interposer. Each of the assemblies described herein can be implemented with these various processor carriers.

One method to construct the assembly 100 is as follows. A processor 156 and its associated interposer board 114 can be inserted into the socket 112. The heatsink 102 is then thermally coupled to the processor 156. The heatsink 102 is also mechanically coupled to the interposer 114 and/or the main board 116. The mechanical connection can be made with fastener, clamps or other suitable arrangements. The edge connector 110 is then connected to the appropriate end of the interposer 114. The VRM subassembly is then attached to the heat dissipating device 102, for example, a heatsink or vapor chamber.

The advantages of orienting the VRM board in a right-angle fashion (with regard to the mother board) and adjacent to the heatsink are that the voltage regulator (VR) components, its interconnects, and thermal management are lifted off of the main board. This results in less real-estate being taken up by the VRM which is an advantage over typical VRM designs as well as voltage regulators which have components mounted onto the main board itself.

Of course, in all of the embodiments described herein, the orientation of the VRM board can be substantially at a right angle to the main board. Substantially at a right angle means that the orientation of the VRM board is within a reasonable variance from a right angle without significantly impacting use of the mother board. Alternatively, the VRM board can be oriented at other angles including in the ranges of 70°–80°, 60°–70°, 50°–60° and 40°–50°. These orientations can be achieved through the interconnect assembly or through the connection mechanism which couples the VRM board to the heat sink, the processor carrier or the mother board. Additionally, the VRM board can be mounted so that its plane is not parallel to the plane of the main board.

The second advantage is that the VR may now be placed in the same air-flow path as the microprocessor or main electronic device which typically has superior air-flow and thermal management as compared to other components in the electronic system design. The orientation may also be made to be in parallel with the fin array of the heatsink which has a further advantage for cross-flow thermal arrangements where the air is plenumed in a direction parallel to the fin orientation. In other words, the VRM PCB acts as another fin and can take advantage of the air-flow given to that region. An additional benefit is that by locating the VRM close or onto the heatsink, the VRM can take advantage of some of the mechanical retention features already built in for the heatsink to device retention. This can further reduce the solution cost.

Figure 2:
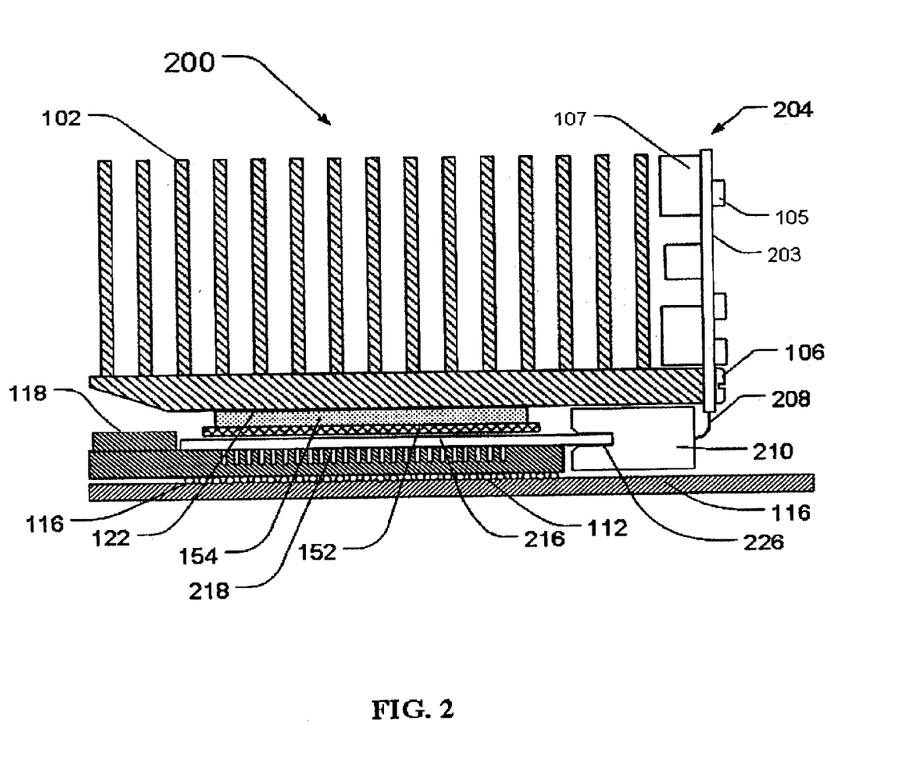
FIG. 2 is a side view of a right-angle VRM architecture with the edge connector connected to one side of a modified interposer.

Referring now to FIG. 2, the second embodiment of the present invention is shown in another side 'end' view similar to that shown in FIG. 1A. In this embodiment the edge connector is shown connecting to a side of the interposer which is offset 90 degrees from the orientation shown in FIG. 1. Right-angle VRM assembly 204 is similar to that shown in the previous embodiment except that now socket 112 has actuation mechanism 118 on side opposite to the edge card connector 210. VRM assembly 204 is still connected to heat dissipating device 102 and secured through a fastener such as 106. Flex circuit 208 egresses from bottom side of VRM board 203 and allows an easier connection to the interposer 216. Construction of assembly 200 may be accomplished through a number of methods. One such method is to assemble right-angle VRM to heatsink 102 and then assemble the lid 154 of the electronic device to heatsink 102. Typically, a retention and alignment mechanism is used to mechanically secure the heatsink 102 where the heatsink is held down to the socket 112 and/or the main board 116. An alignment and retention feature may be added to allow connector 210 to be securely supported to aid in the connection to the interposer at the interposer/edge connector interface 226 without disrupting the mechanical assembly or the thermal interface 122. Interposer 216 is usually securely fastened to the socket through the interconnect such as pin array 218.

Figure 3:
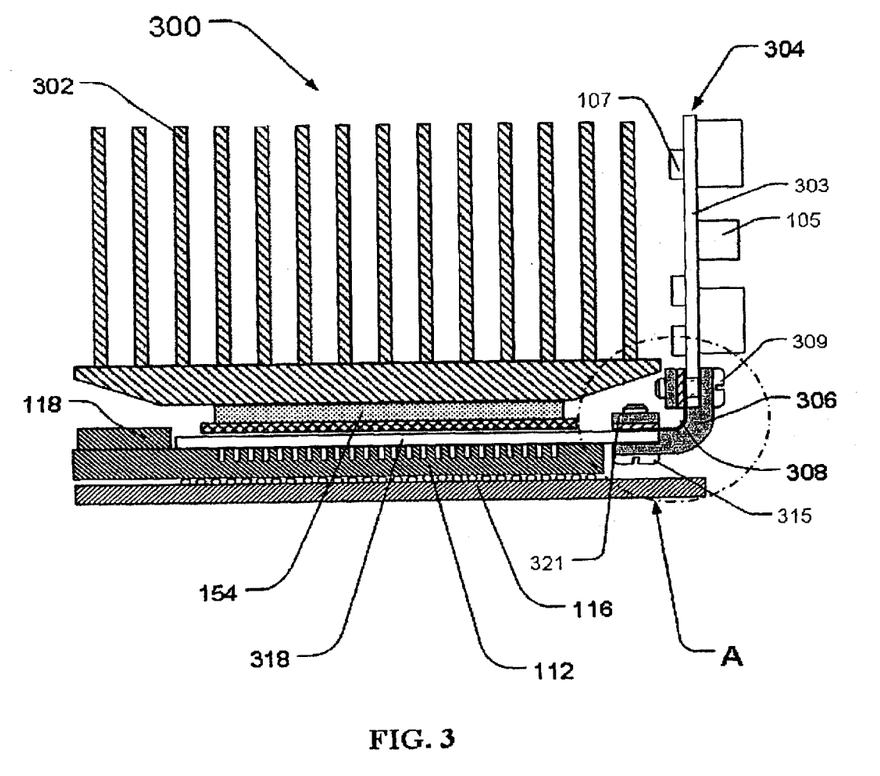
FIG. 3 is a side view of a right-angle VRM architecture which uses a connection method to both sides of the package, as in an edge connector, but with a bracket where the bracket is mechanically mounted to the interposer and is also electrically active (e.g. at ground)

FIG. 3 shows another embodiment of the present invention which does not use an edge connection for the interconnect assembly and does not rely on any connection to the heatsink for mechanical connection. Right-angle VRM subassembly 304 is similar to those shown in the previous drawings. Subassembly 304 is secured to bracket 306 via fastener 309. In turn, bracket 306 is secured to interposer 318 by fastener 315. Fasteners 309 and 315 are preferably disconnectable to allow for replacement of the VRM assembly. Alternatively, the fasteners can be replaced with permanent connections. A flex circuit 308 is used to interconnect electrically power and signals from PCB 303 to interposer 318. Bracket 306 is typically made of a material which is electrically conductive and may be used for returning currents to interfaces on VRM board 303 and interposer 318.

Figure 4:
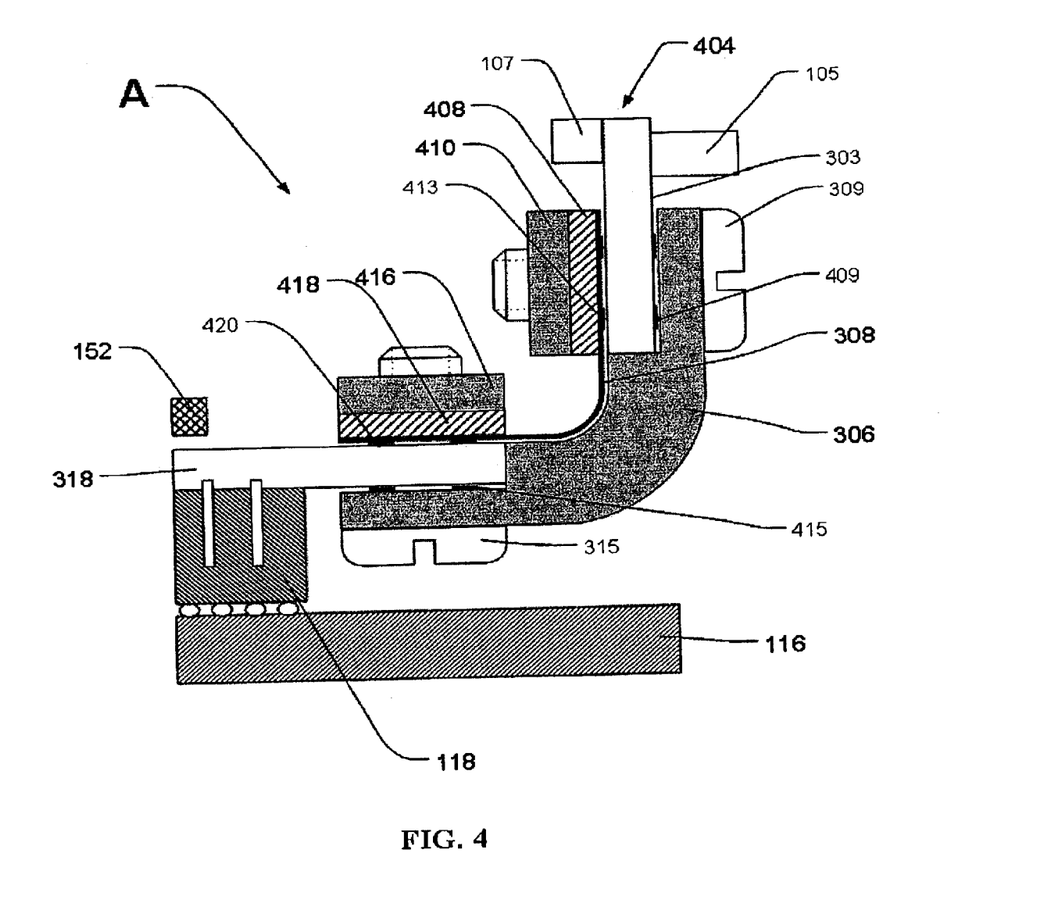
FIG. 4 is an enlarged view of Section A of FIG. 3.

FIG. 4 shows an enlarged view of Section A shown in FIG. 3. Interfaces, such as 409 make electrical connection (typically ground) between interposer 318 and VRM PCB 303. Although not shown, the pads may be contiguous strips which extend along the length of one side of the VRM board and/or the interposer. That is, one strip may be dedicated for power distribution and the other for ground return as well as other discrete pads may be dedicated for signal connections. Fastener elements 309, 408, and 410 secure VRM assembly 404 to bracket 306 and retain flex circuit 308 as well while maintaining compression on contacts on flex circuit 308 such as 413. Similarly fasteners 315, 418, and 416 secure bracket 306 to interposer 318 while securing and aligning flex circuit 308 to interposer 318 and maintaining compression through contacts, such as 420. Fastening elements 408 and 418 may be resilient and/or compliant to additionally control and maintain force on contacts 413 and 420, respectively.

Figure 5:
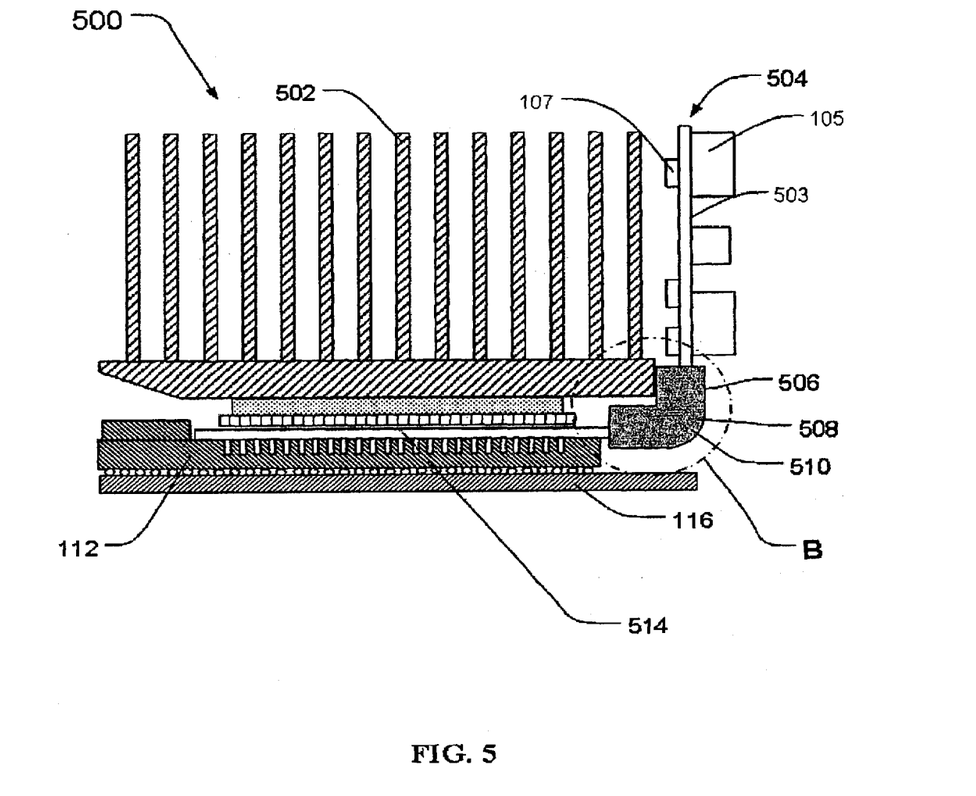
FIG. 5 is a side view of a right-angle VRM architecture which uses a connection method for the right-angle VRM architecture where the electrical connection is made to one side of the substrate and VRM.

FIG. 5 is another embodiment of the present invention using a further interconnect assembly. Assembly 500 comprises a heatsink 502 which is attached to an electronic subassembly as described in previous embodiments. As shown in FIG. 5 a bracket is used to secure VRM board 503 to interposer 514 electrically and mechanically. Note though that in this embodiment the bracket 510 is separably connected to both interposer 514 and right-angle VRM subassembly 504. The bracket has an opposing sub-bracket 506 which helps to retain flex circuit 508 which resides between the two bracket components 506 and 510.

Figure 7:
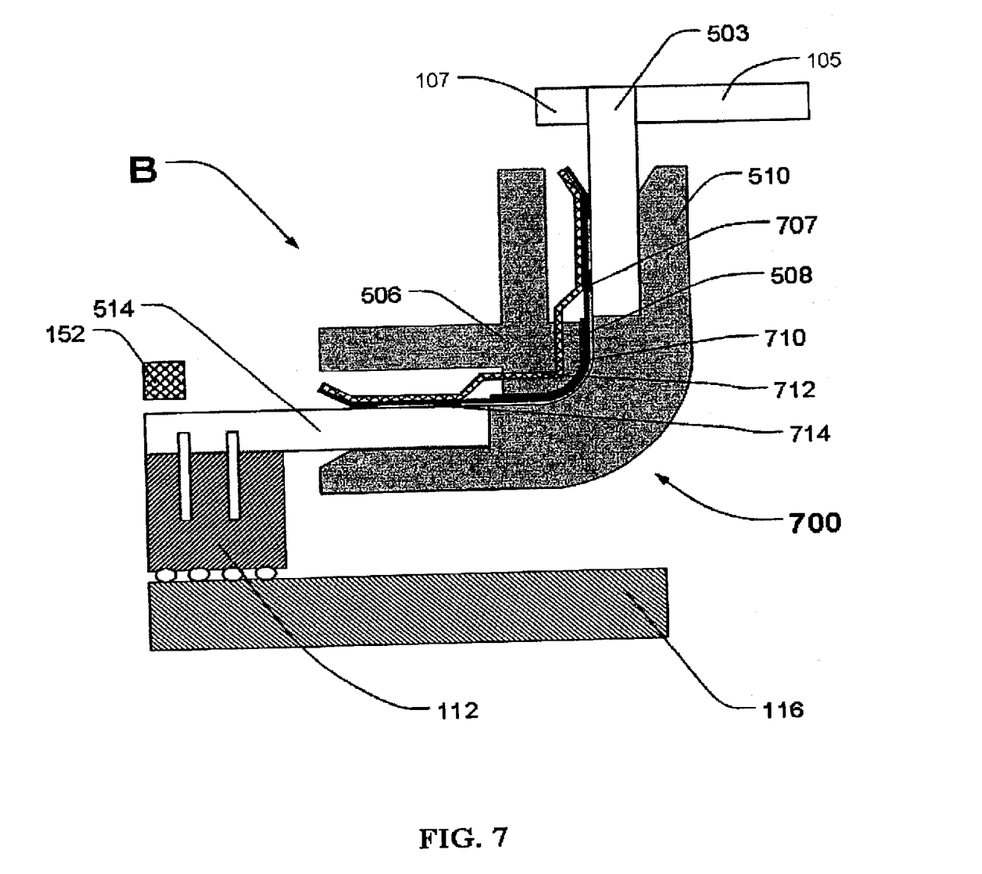
FIG. 7 is an enlarged view of Section B of FIG. 5.

FIG. 7 shows Section B from FIG. 5 in more detail. The bracket 510 is mechanically attached through bracket portion 710 to bracket 506. A spring-member 712 extends through bracket portion 710 and provides pressure on flex circuit 508 and contacts 707 and 714 thereof. The circuit 508 also extends through an appropriate opening in bracket portion 710. VRM board 503 and interposer 514 have surface pads (not shown) which electrically connect to copper layers for power distribution (also not shown). In assembly, bracket subassembly 700 may be connected to either interposer 514 and then VRM PCB 503 or conversely.

Figure 6:
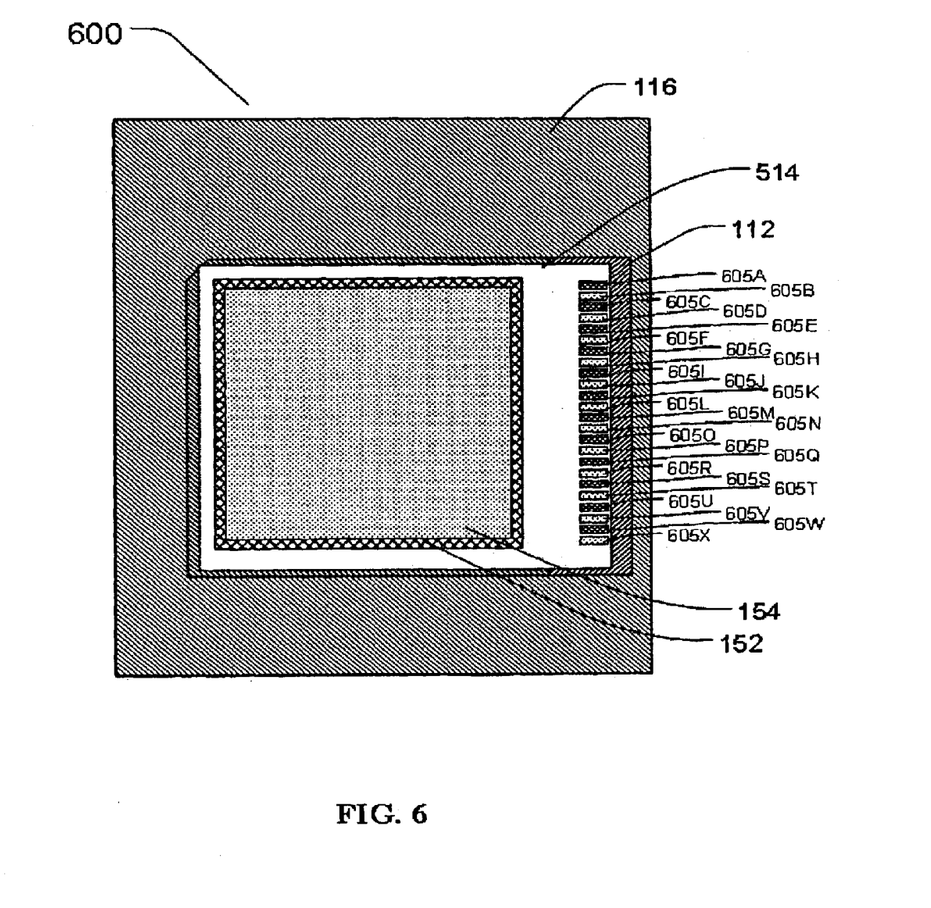
FIG. 6 shows an example power/ground pattern on the top side of the substrate for making electrical connection from the right-angle VRM to the substrate.

FIG. 6 shows a top view of assembly 600 which comprises lid 154 and substrate 152 with interposer 514 mounted to socket 112 which is mounted to main board 116, without the heatsink or other mechanical and electrical elements shown, with contact pads on its top surface. This arrangement can be used with any of the embodiments described herein. Contact pads 605A through 605X are located adjacent to an edge of the interposer 514. The contact pads are inter-digitated power and ground contact pads for electrical connection between the VRM board and interposer 514. Inter-digitated contacts are used for making low inductance connections. As an example, contact 605A may be assigned as a power contact and contact 605B assigned a ground contact or current return for power contact 605A. This pattern may be duplicated across interposer 604 on a given side of the interposer as shown on the right side of interposer 514 in assembly 600. Signals may also be connected between the interposer and one or more of the contact pads shown may be assigned to send signals between the VRM board and the interposer for power conditioning or other functions. The contact pads 605A through 605X do not represent the only quantity or type of contacts that may be used to conduct power and/or signals between the VRM board and interposer. Multiple rows of contacts—that is a duplicate set of contact pads on the interposer—less or more contacts, or non-interdigitated connections may be used as well which would not detract from the invention disclosed herein.

Figure 8:
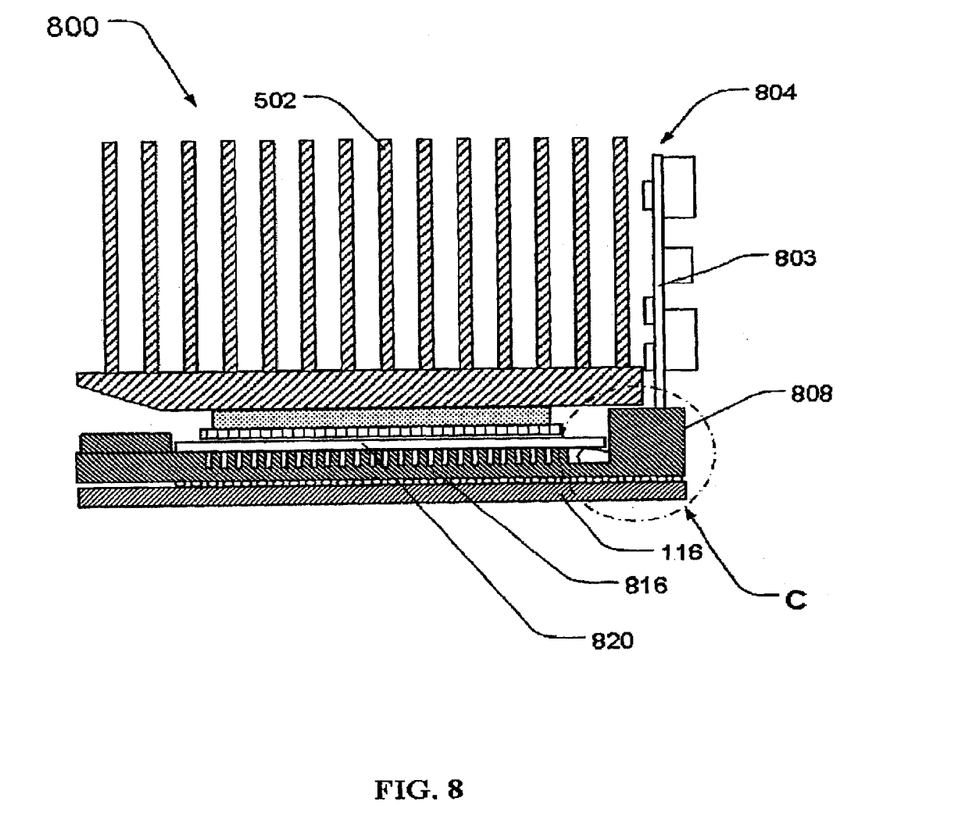
FIG. 8 is a side view of a right-angle architecture for interconnecting the substrate to the VRM with the use of an integrated connection system as part of the socket for the electronic device.

FIG. 8 shows an embodiment where the right-angle VRM is mounted into a portion of socket 816 and where an interconnect resides which is used to connect power and signals from the VRM PCB 803 to the interposer 820. In this embodiment, the interconnect assembly is a portion of socket 816 and a connection. Note that no mechanical retention or alignment is shown attaching to heatsink 502 but this need not be so. A separate retention and alignment feature may be used to engage VRM subassembly 804 into socket 816. Retention and alignment mechanisms for VRM's are well known in the state of the art and many mechanisms may be used without detracting from the present invention.

Figure 9:
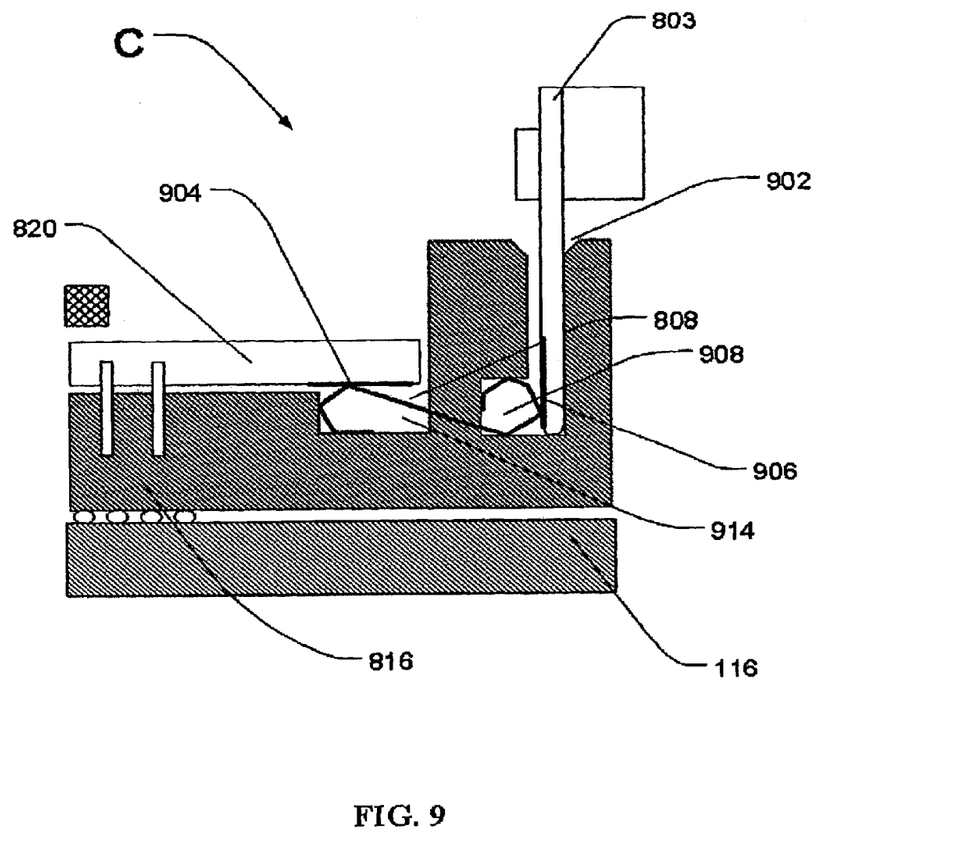
FIG. 9 is an enlarged view of Section C of FIG. 8.

Section C from FIG. 8 is shown in detail with the end cut-away in FIG. 9. VRM board 803 is engaged into socket region 908 where chamfer 902 is used to lead-in VRM PCB 902 without damage. Connector 808 makes contact to surface pads 906 on PCB 803 which make electrical connection to layers internal to PCB 803 (not shown). Electrical connector 808 has an opposite end which makes electrical connection to pads 904 on the underside of interposer 820 which make electrical connection to layers within or on interposer 820. Other methods of interconnection with this arrangement to the VRM are also possible which are not beyond the scope of this patent such as making electrical connection between the VRM and the main board through a connection system which is part of socket 816. Additionally, a plurality of separate electrical connectors can be used.

Figure 10:
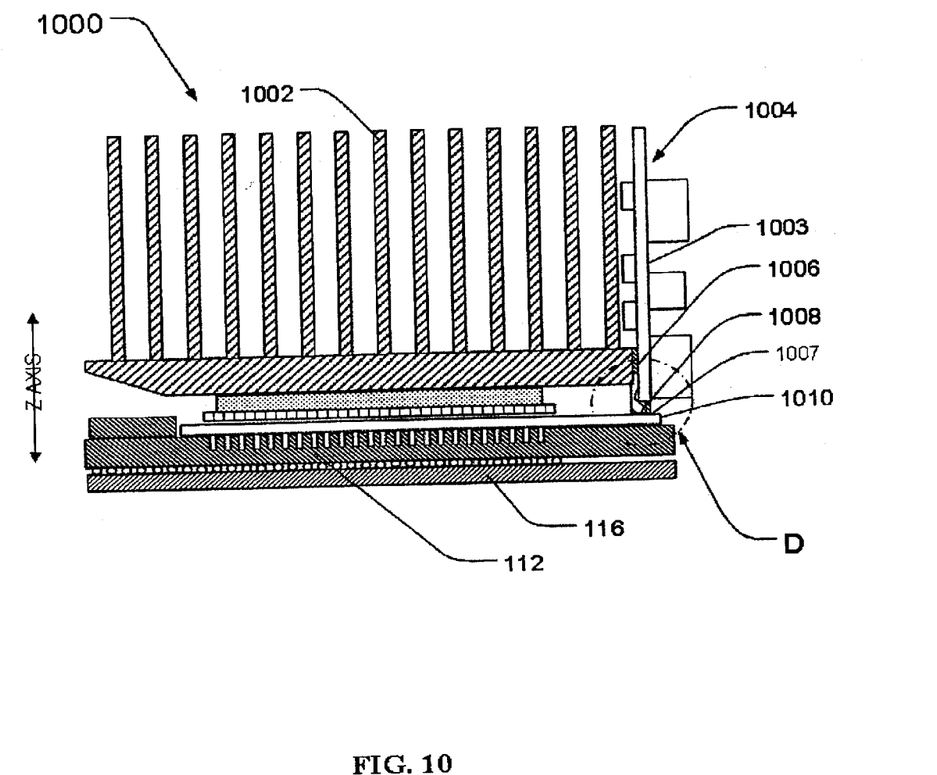
FIG. 10 is a side view of a right-angle architecture which makes the connection to the top surface of the substrate with a connector mounted to the VRM.
Figure 11:
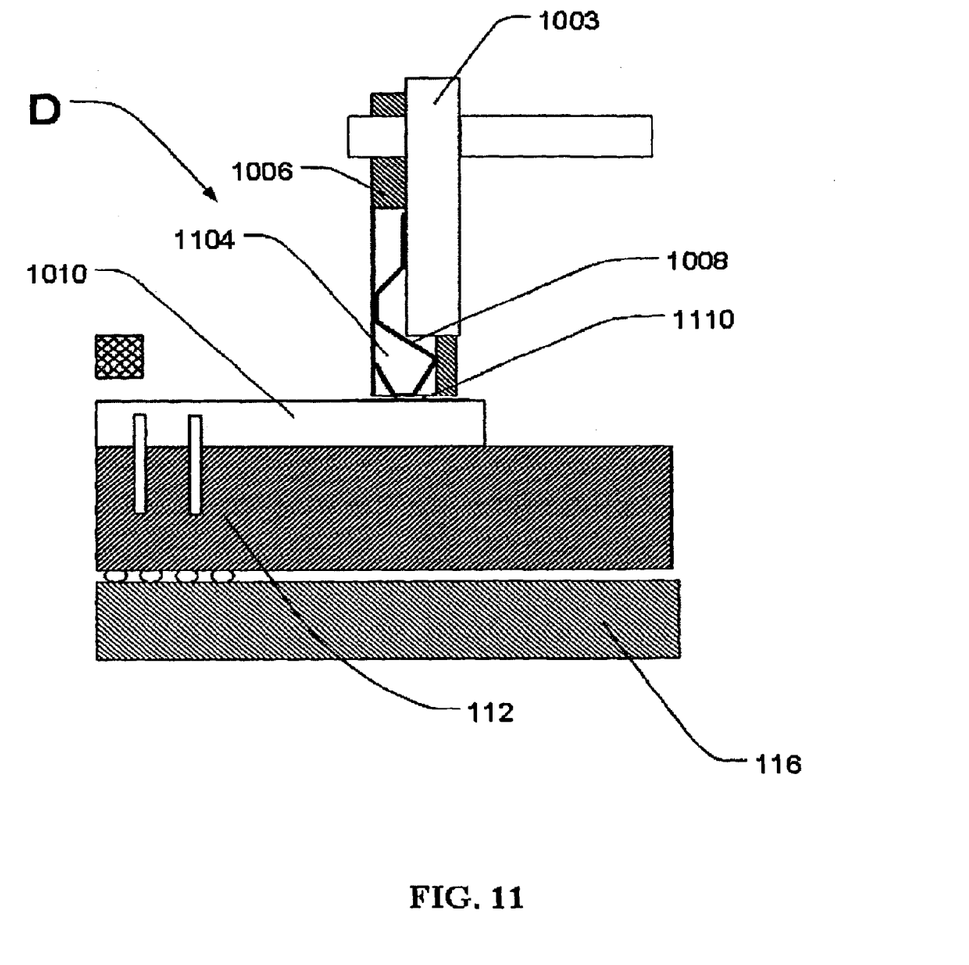
FIG. 11 is an enlarged view of Section D of FIG. 10.

FIG. 10 shows subassembly 1000 which can have most of the components described previously in the other embodiments with a further interconnect assembly. In this embodiment the interconnect assembly is mounted to VRM board 1003 which in turn mounts to surface pads, such as 1007 on the surface of interposer 1010. An electrical connector 1008 mounted to VRM board 1003 has housing support 1006 which is used for mechanical alignment and retention of the connector to VRM board 1003. Most embodiments would include a plurality of such electrical connectors. Connector 1008 is z-axis compressible. The lower end of the connector extends beyond the housing support 106. When the VRM subassembly 1004 is inserted down upon the surface of the interposer 1010, connector 1008 is compressed and makes electrical connection between VRM PCB 1003 and interposer 1010. Section D is shown in more detail in FIG. 11. VRM board 1003 has connector 1008 which is retained through mechanical housing 1006 which has region 1104 where connector 1008 is retained. When the right-angle VRM subassembly is brought down in a z-axis fashion to top surface of interposer 1010, connector 1008 is compressed and makes electrical connection to surface pad 1110.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed:

1. An assembly comprising:
   a mother board having a socket;
   a processor carrier mounted on the socket of the mother board and having a first processor carrier side, a second substrate side substantially opposite the first processor side and electrical contacts for receiving power and ground adjacent to an edge of the processor carrier;
   a processor mounted on the first processor carrier side and having a top surface;
   a heat sink thermally coupled to said processor and located adjacent the top surface of the processor; and
   a circuit board having a power conditioning circuit, a first side and a second side substantially opposite the first side, the circuit board located adjacent the heat sink and at substantially a right angle to said mother board; and
   an interconnect assembly coupled to the processor carrier and the circuit board, the interconnect assembly having an electrical path between the electrical contacts of the processor carrier and the circuit board.

2. The assembly of claim 1 wherein the interconnect assembly comprises a flex connector electrically coupled to an edge connector.

3. The system of claim 1, wherein the interconnect assembly comprises a bracket assembly which mechanically and electrically couples the circuit board and the processor carrier.

4. The system of claim 1, wherein the processor carrier comprises a substrate and the interconnect assembly comprises a connector which mechanically and electrically couples the circuit board and the substrate.

5. A processor power supply assembly comprising:
   a main board;
   an interposer board electrically coupled to said main board, said interposer board having a processor thereon;
   a Voltage Regulation Module (VRM) sub-assembly having a VRM board with a power conditioning circuit; and
   a socket mounted on said main board and said interposer board being mounted in said socket, said socket including an interconnect assembly electronically coupling said power conditioning circuit to said interposer board and removably mechanically fixing said VRM board such that a plane of said VRM board is substantially orthogonal to a plane of said main board.

6. The system of claim 5 wherein said interconnect assembly comprises a plurality of electrical connectors.

7. The assembly of claim 5 wherein said interconnect assembly comprises an edge connector.

8. The system of claim 5 further comprising a heatsink thermally coupled to said processor.

9. An assembly comprising:
   a mother board having a socket;
   a processor carrier mounted on the socket of the mother board and having electrical contacts for receiving power and ground adjacent to an edge of the processor carrier;
   a processor mounted on the processor carrier;
   a heat sink thermally coupled to said processor; and
   a circuit board having a power conditioning circuit, a first side and a second side substantially opposite the first side, the circuit board located adjacent the heat sink and at substantially a right angle to said mother board; and
   an interconnect assembly having an electrical power path between the electrical contacts of the processor carrier and the circuit board, and mechanically coupling the circuit board at a substantially right angle to the mother board.

10. The assembly of claim 9 wherein the interconnect assembly comprises a flex connector electrically coupled to an edge connector.

11. The system of claim 9, wherein the interconnect assembly comprises a bracket assembly which mechanically couples the circuit board and the processor carrier.

12. The system of claim 9, wherein the processor carrier includes a substrate and the interconnect assembly mechanically and electrically couples the circuit board and the substrate.

13. The system of claim 9, further comprising a fastener which couples the interconnect assembly to the heat sink.

* * * * *